US012655537B2

(12) United States Patent
Suzuki

(10) Patent No.: US 12,655,537 B2
(45) Date of Patent: Jun. 16, 2026

(54) EPITAXIAL WAFER

(71) Applicant: SHIN-ETSU HANDOTAI CO., LTD., Tokyo (JP)

(72) Inventor: Atsushi Suzuki, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 18/861,658

(22) PCT Filed: Apr. 4, 2023

(86) PCT No.: PCT/JP2023/013945
§ 371 (c)(1),
(2) Date: Oct. 30, 2024

(87) PCT Pub. No.: WO2023/218800
PCT Pub. Date: Nov. 16, 2023

(65) Prior Publication Data
US 2025/0327211 A1      Oct. 23, 2025

(30) Foreign Application Priority Data
May 10, 2022     (JP) ................................. 2022-077287

(51) Int. Cl.
B32B 3/00          (2006.01)
C30B 25/18         (2006.01)
(Continued)

(52) U.S. Cl.
CPC ............... C30B 29/52 (2013.01); B32B 3/00 (2013.01); C30B 25/18 (2013.01); H10D 62/832 (2025.01)

(58) Field of Classification Search
CPC ......... C30B 29/06; C30B 29/08; C30B 29/34; C30B 29/36; C30B 29/38
See application file for complete search history.

(56) References Cited

U.S. PATENT DOCUMENTS 9,006,865 B2 *   4/2015   Ikuta ................... H01L 21/0243
                                                           438/33
9,938,638 B2     4/2018   Hagimoto et al.
(Continued)

FOREIGN PATENT DOCUMENTS

JP          H03-270072 A      12/1991
JP          2005306680 A      11/2005
(Continued)

OTHER PUBLICATIONS

Japanese Decision of Refusal in application No. 2022-77287 issued on May 13, 2025.
(Continued)

*Primary Examiner* — Elizabeth E Mulvaney
(74) *Attorney, Agent, or Firm* — Harness, Dickey & Pierce, P.L.C.

(57)          ABSTRACT

The present invention is an epitaxial wafer, including an epitaxial film of a semiconductor material different from silicon being formed on a silicon substrate, in which the epitaxial film has a film thickness of less than 1 at a wafer outer-peripheral portion when a film thickness at a center of the wafer is defined as 1. Thereby, the epitaxial wafer having a heteroepitaxial film with few defects without dependence on a dopant concentration or a variety of a silicon wafer is provided.

6 Claims, 2 Drawing Sheets

1

(51) Int. Cl.
    *C30B 29/52*         (2006.01)
    *H10D 62/832*     (2025.01)

(56)           References Cited

U.S. PATENT DOCUMENTS

| | | | |
|---|---|---|---|
| 2009/0214843 A1* | 8/2009 | Lite | C30B 25/16 |
| | | | 257/E21.09 |
| 2013/0087807 A1 | 4/2013 | Ikuta et al. | |
| 2013/0337638 A1 | 12/2013 | Kawashima et al. | |
| 2015/0028457 A1 | 1/2015 | Shikauchi et al. | |
| 2015/0171173 A1 | 6/2015 | Umeda et al. | |
| 2016/0289815 A1 | 10/2016 | Burgess et al. | |
| 2021/0189591 A1* | 6/2021 | Xu | C30B 29/36 |

FOREIGN PATENT DOCUMENTS

| | | | |
|---|---|---|---|
| JP | 2009206516 A | 9/2009 | |
| JP | 4972330 B2 | 7/2012 | |
| JP | 2013171898 A | 9/2013 | |
| JP | 20143142 A | 1/2014 | |
| JP | 201518869 A | 1/2015 | |
| JP | 2015-170648 A | 9/2015 | |
| JP | 2018-011060 A | 1/2018 | |
| WO | 2011161975 A1 | 12/2011 | |
| WO | 2014041736 A1 | 3/2014 | |

OTHER PUBLICATIONS

English translation of International Preliminary Report on Patentability in application No. PCT/JP2023/013945 issued on Nov. 21, 2024.

Japanese Notification of Reasons for Refusal in application No. 2022-077287 issued on Jan. 21, 2025.

1 International Search Report in application No. PCT/JP2023/013945 mailed Jun. 6, 2023: ISA/JP.

Japanese Notification of Reasons for Refusal in application No. 2022-77287 issued on Feb. 3, 2026.

Extended European Search Report in application No. 23803283.3 issued on Mar. 13, 2026.

* cited by examiner

[FIG. 1]
<u>1</u>
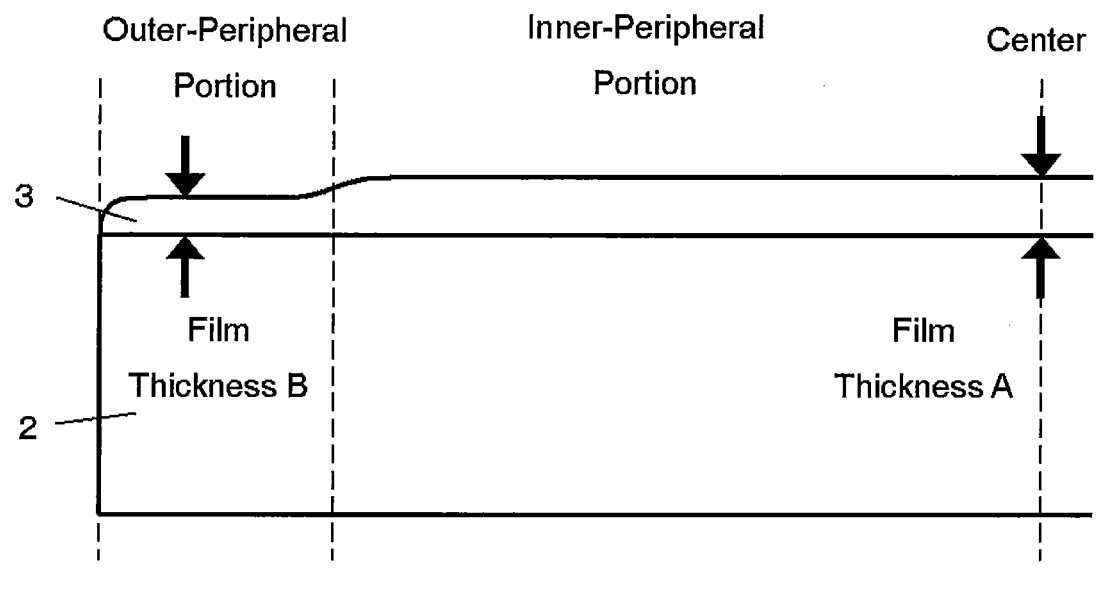
[FIG. 2]
<u>11</u>
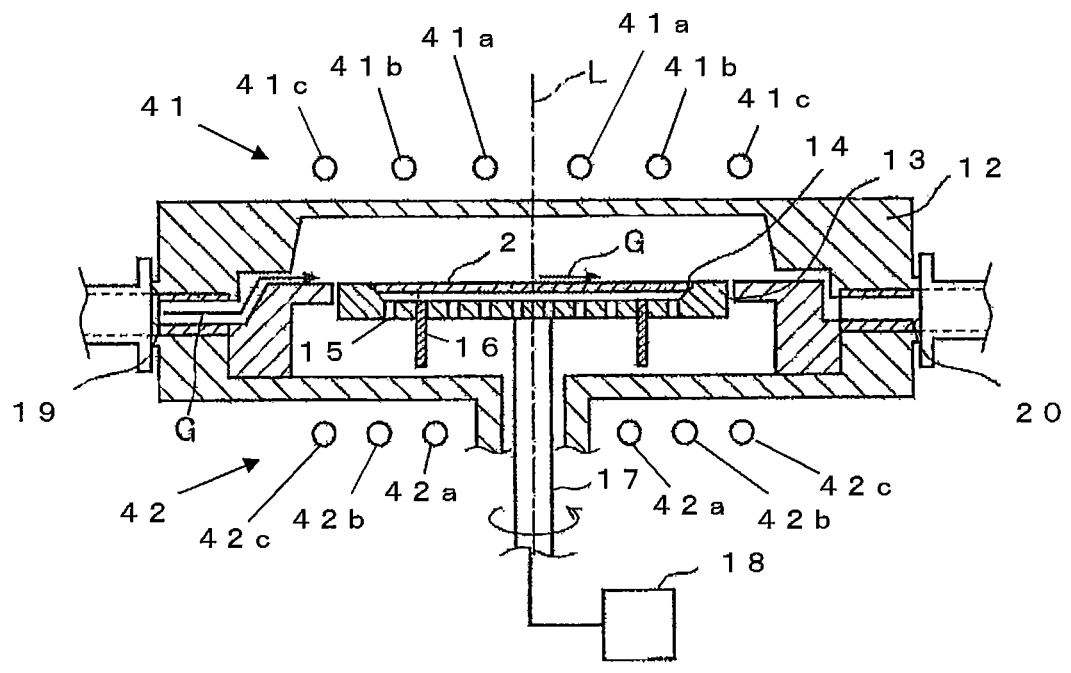

[FIG. 3]
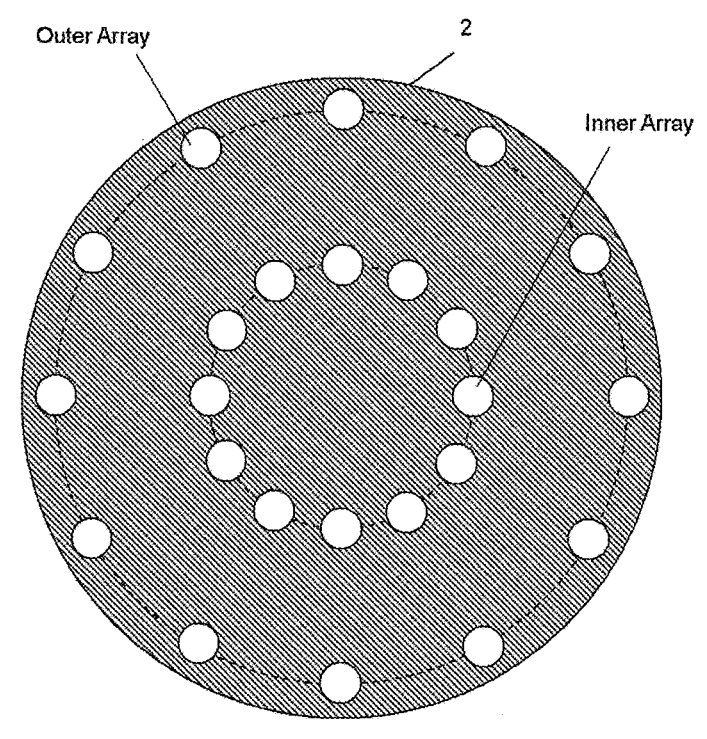
[FIG. 4]
<u>1</u>
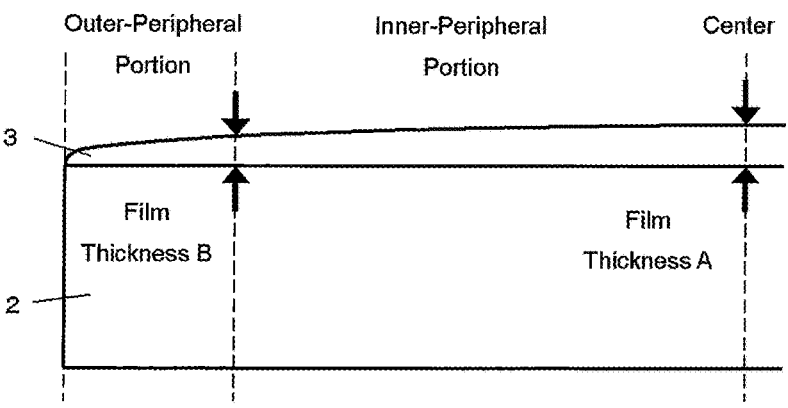

EPITAXIAL WAFER

CROSS-REFERENCE TO RELATED APPLICATIONS

This application is a U.S. National Phase Application under 35 U.S.C. 371 of International Application No. PCT/JP2023/013945, filed Apr. 4, 2023, which claims priority to Japanese Application No. 2022-077287, filed May 10, 2022. The entire disclosures of the above applications are incorporated herein by reference.

TECHNICAL FIELD

The present invention relates to an epitaxial wafer, in which an epitaxial film of a semiconductor material different from silicon is formed on a silicon substrate.

BACKGROUND ART

With respect to wafers for a cutting-edge device, semiconductor materials other than silicon, such as silicon germanium, silicon carbide, and gallium nitride, are now also considered as candidates. However, when heteroepitaxially growing on a silicon wafer, stress attributed to a difference in lattice constant between silicon and an epitaxial film is applied thereto, and excessive stress results in problems of triggering stacking faults or threading dislocations.

In conventional heteroepitaxial growth, a method to use a low-resistance silicon wafer containing high concentration dopant has been proposed to suppress stress (Patent Document 1). However, other problems, such as auto-doping due to outward diffusion of the dopant from the wafer, also arise.

CITATION LIST

Patent Literature

Patent Document 1: JP 4972330 B

SUMMARY OF INVENTION

Technical Problem

The present invention has been made in view of the above-described circumstances. An object of the present invention is to provide an epitaxial wafer having a heteroepitaxial film with few defects without dependence on a dopant concentration or a variety of a silicon substrate.

Solution to Problem

To achieve the above object, the present invention provides an epitaxial wafer, comprising an epitaxial film of a semiconductor material different from silicon being formed on a silicon substrate, wherein the epitaxial film has a film thickness of less than 1 at a wafer outer-peripheral portion when a film thickness at a center of the wafer is defined as 1.

According to such an inventive epitaxial wafer, a resulting heteroepitaxial wafer has few defects, in which small stacking fault density and small threading dislocation density without dependence on a dopant concentration or a variety of the silicon substrate.

In this case, the wafer outer-peripheral portion can be in a range of up to 5 mm inward from a periphery, can be preferably in a range of up to 10 mm inward from a periphery, and can be more preferably in a range of up to 20 mm inward from a periphery.

Such an epitaxial wafer more reliably has few defects. In addition, the wider the range of the wafer outer-peripheral portion where the film thickness is less than 1, the fewer the defects to be formed.

Moreover, the epitaxial film can have a film thickness of 0.95 or more and less than 1 at the wafer outer-peripheral portion, the film can preferably have a film thickness of 0.9 or more and less than 1 at the wafer outer-peripheral portion, and the film can more preferably have a film thickness of 0.8 or more and less than 1 at the wafer outer-peripheral portion.

Such an epitaxial wafer more reliably has few defects. In addition, the thinner the film thickness at the wafer outer-peripheral portion compared with the film thickness at the center of the wafer, the fewer the defects.

Moreover, the epitaxial film can be any of a silicon germanium film, a germanium film, a silicon carbide film, and gallium nitride film.

It is suitable because these semiconductor materials are used for cutting-edge devices.

In addition, the epitaxial wafer can have a diameter of 300 mm or larger.

In recent years, enlargement (larger diameter) of wafers has been desired, and the wafer having a diameter of 300 mm or larger can meet such a need.

Advantageous Effects of Invention

The inventive epitaxial wafer has excellent quality in which defects such as the stacking fault or the threading dislocation attributed to stress caused by a difference in lattice constant during a heteroepitaxial growth are extremely reduced.

BRIEF DESCRIPTION OF DRAWINGS

FIG. 1 is an explanatory view illustrating an example of an epitaxial wafer according to the present invention.

FIG. 2 is an explanatory view illustrating an example of an epitaxial growth apparatus.

FIG. 3 is an explanatory view illustrating an example of an arrangement of lamp arrays in a plan view.

FIG. 4 is an explanatory view illustrating an example of an epitaxial wafer according to the present invention.

DESCRIPTION OF EMBODIMENTS

Hereinafter, an embodiment of the present invention will be described with reference to the drawings. However, the present invention is not limited thereto.

FIG. 1 is an example of the inventive epitaxial wafer. As shown in FIG. 1, the inventive epitaxial wafer 1 includes an epitaxial film 3 formed on a silicon substrate (single crystal substrate) 2.

The silicon substrate 2 is not particularly limited and can be made by cutting out in a wafer-shape from a silicon single crystal ingot produced by a Czochralski method, a floating zone method, or the like, and by being subjected to lapping processing, grinding processing, etching processing, polishing processing, or the like.

In addition, a kind and a concentration of dopants, and a variety (resistivity, diameter, thickness, oxygen concentration, etc.) are not limited and can be determined as appropriate. The present invention is of high quality with reduced defect density without relying on the control of these dopants.

Moreover, the silicon substrate 2 can have a diameter (diameter of epitaxial wafer 1) of, e.g., 300 mm or larger, and even 450 mm or larger. In order to meet the recent demand for enlargement of the diameter, the larger, the better, and thus the upper limit of the diameter is not particularly limited. Conversely, relatively small diameter sizes, such as 200 mm or even smaller, are also acceptable.

The epitaxial film 3 may be made of a semiconductor material different from silicon (heteroepitaxial film). The semiconductor material can be any of these, for example, a silicon germanium film, a germanium film, a silicon carbide film, and gallium nitride film. With such a material, it is suitable as the epitaxial wafer for a cutting-edge device.

In addition, this epitaxial film 3 has film thickness distribution in which a film thickness (film thickness B) at a wafer outer-peripheral portion (hereinafter also simply referred to as the outer-peripheral portion) is less than 1 when a film thickness (film thickness A) at the center of the wafer (hereinafter also simply referred to as the center) is defined as 1. In this way, as the film thickness at the outer-peripheral portion is thinner than that at the center, lattice relaxation is less prone to be generated at the outer-peripheral portion, and thus the density of defects such as stacking fault and threading dislocation in the epitaxial film 3 is smaller, resulting in excellent quality.

This epitaxial layer 3 only needs to satisfy the above relation between the film thickness distributions of the center and the outer-peripheral portion, and a film thickness distribution of the wafer at an inner-peripheral portion (hereinafter also simply referred to as the inner-peripheral portion) located between the center and the outer-peripheral portion can be arbitrary. For example, as shown in FIG. 1, the epitaxial film 3 has a shape such that the film thickness is constant at the inner-peripheral portion, including the center when viewed from a side, the film thickness becomes thinner toward the periphery near a boundary between the inner-peripheral portion and the outer-peripheral portion and the epitaxial film 3 can be constant in the thin film thickness at the outer-peripheral portion. Conversely, as shown in FIG. 4, the film thickness is the thickest at the center and the film thickness becomes thinner gradually toward the periphery when viewed from the side; that is, the shape can be descending gently toward the periphery.

Here, a range of the wafer outer-peripheral portion is not particularly limited but can be, for example, in a range of up to 5 mm inward from the periphery of the wafer. When the outer-peripheral portion, which has a thinner film thickness than the center, is maintained within this range, the epitaxial wafer can more reliably have few defects.

Further, the range of the outer-peripheral portion is preferably in a range of up to 10 mm inward from the periphery, and is more preferably in a range of up to 20 mm inward from the periphery. The wider the range of the outer-peripheral portion, the lower the defect density can be.

Note that although the size of the range of the outer-peripheral portion can be determined as appropriate according to the diameter of the epitaxial wafer 1, and the like, when a decrease of defects attributed to stress due to a difference in lattice constant is a purpose, for example, it is basically sufficient to make a range of up to 50 mm inward from the periphery the outer-peripheral portion.

Moreover, when the film thickness at the center is defined as 1, as described above, the film thickness at the outer-peripheral portion may be less than 1; in particular, the thickness can be 0.95 or more and less than 1. In this case, the wafer can more reliably have fewer defects.

Further, the film thickness at the outer-peripheral portion is more preferably 0.9 or more and less than 1, and further more preferably 0.8 or more and less than 1. The smaller the film thickness at the outer-peripheral portion, the lower the defect density can be.

Although the size of the film thickness at the outer-peripheral portion relative to the film thickness at the center can be determined according to the diameter of the epitaxial wafer 1 or an absolute value of the film thickness of the epitaxial film 3, etc. (however, less than 1 as described above), when a decrease of defects attributed to stress due to a difference in lattice constant is a purpose, it is basically sufficient to be, for example, 0.6 or more and less than 1.

Moreover, the film thickness at the outer-peripheral portion relative to the film thickness at the center is stated to be less than 1, but it is preferable to be 0.99 or less to lower the defects more reliably, more preferably to be 0.98 or less.

Incidentally, in the case of a normal epitaxial wafer, an epitaxial film is generally required to have uniformity in film thickness; thus, film thicknesses at a center and film thickness at an outer-peripheral portion have basically the same values. Moreover, the wafer outer-peripheral portion is more prone to generate abnormal growth of the epitaxial layer, which often leads to the outer-peripheral portion being thicker than the center.

Next, an epitaxial growth apparatus (RP-CVD apparatus) usable for producing the inventive epitaxial wafer 1 is described with reference to FIG. 2. An epitaxial growth apparatus 11 of single wafer processing in FIG. 2 is an apparatus to vapor-phase grow the epitaxial film 3 of the semiconductor material different from silicon on the surface of one silicon substrate 2.

The epitaxial growth apparatus 11 is provided with a chamber 12 configured with a transparent quartz member, etc. In the chamber 12, a susceptor 13 for mounting the silicon substrate 2 to be epitaxially grown is arranged. The susceptor 13 can be used, which is made of, for example, SiC, or a graphite substrate coated with SiC. The susceptor 13 is formed in a disk shape and arranged with upper and lower surfaces thereof horizontally.

A pocket 14 in recess shape is formed on the upper surface of the susceptor 13, and the silicon substrate 2 is mounted inside this pocket 14. In addition, a plurality of through holes 15 are formed in the susceptor 13, which passes through to a back surface. These through holes 15 may be, for example, holes for inserting a lift pin 16. The lift pin 16 is used for inserting and removing the silicon substrate 2 into and out of the pocket 14. Or, the through holes may be used for other purposes (for, example, holes for suppressing generation of haze, referred to as halo, and surface roughness on a back surface of the epitaxial wafer). Further, a type of the susceptor 13 without the through hole 15 may also be used.

The back surface of the susceptor 13 is supported by a shaft 17. The shaft 17 is provided so as to align an axis L thereof with the center of susceptor 13. The shaft 17 is connected to a driving section 18 that rotates the susceptor 13 around the axis L via the shaft 17.

Above and below chamber 12, lamps 41 and 42 are arranged, which heat the silicon substrate 2 during epitaxial growth to an epitaxial reaction temperature (for example, 400 to 1200° C.).

In an example in FIG. 2, in the case of the plan view, lamp group arrays formed in a circular shape are arranged in three concentric arrays. That is, an inner array 41a, a middle array 41b, and an outer array 41c are arranged at the top side, and an inner array 42a, a middle array 42b, and an outer array 42c are arranged in the bottom side. Although an example having three arrays is shown here, it is not limited to thereto and can be made of only two arrays, or four or more arrays.

For example, unlike FIG. 2, and as shown in the plan view in FIG. 3, two arrays may be arranged facing the silicon substrate 2, and the inner array having 12 lamps and the outer array having 12 lamps may be arranged in a circular arrangement, respectively. Although only the top side lamps are shown in the drawing, the bottom side lamps are arranged in the same way. Naturally, regarding the top side and bottom side and the inner and outer lamps, their arrangement position, and the number thereof are not limited to patterns in FIGS. 2 and 3 but can be determined as appropriate.

A power (output) of these lamps can be controlled individually. Therefore, for example, a power ratio (output ratio) can be changed between the top side and bottom side, and the power ratio between the inner and outer arrays can also be changed.

A gas inlet 19 is provided at one end of the chamber 12 in a horizontal direction, and a gas outlet 20 is provided on the opposite side to the side where the gas inlet 19 is provided. From the gas inlet 19, a processing gas G is introduced, in which a raw material gas to be a raw material of the epitaxial film 3, a carrier gas (e.g., hydrogen), and a dopant gas (e.g., a gas containing boron or phosphorus) for adjusting conductivity-type and conductivity of the epitaxial film 2 are included.

As the raw material gas, examples of a silicon germanium film include $SiH_4$ or $SiH_2Cl_2$, and $GeH_4$, etc. Examples of a germanium film include $GeH_4$, etc. Examples of a silicon carbide film include $SiH_4$ or $SiH_2Cl_2$, and $C_3H_8$, etc. Examples of a gallium nitride film include $GaCl$, and $NH_3$, etc.

The processing gas G supplied from the gas inlet 19 flows in an inner space of chamber 12 along a surface of the silicon substrate 2, being rotary held almost horizontally. The processing gas G is then discharged out of the chamber 12 from the gas outlet 20.

Moreover, when epitaxial growth is performed, hydrogen gas is introduced to the chamber 12 from the gas inlet 19 in advance, the silicon substrate 2 is then introduced in the chamber 12 and mounted in the pocket 14 of the susceptor 13. Next, the silicon substrate 2 mounted on the susceptor 13 is heated to a heat treatment temperature (e.g., 1050 to 1200° C.) by lamps 41a to 41c, and 42a to 42c to perform vapor phase etching using hydrogen gas for removing a native oxide film formed on the silicon substrate 2.

Subsequently, the susceptor 13 and the silicon substrate 2 mounted thereon are rotated by the driving section 18, and while controlling the power of the lamps 41 and 42 to make a temperature of the silicon substrate 2 a predetermined reaction temperature (e.g., 1050 to 1180° C.), the processing gas G is supplied from the gas inlet 19, thereby obtaining the epitaxial wafer 1 by vapor phase growing the epitaxial film 3 having a predetermined film thickness.

Further, the film thickness distribution in which the film thickness at the outer-peripheral portion is thinner than the film thickness A at the center, as in the epitaxial film 3 of the inventive epitaxial wafer 1, can be obtained, for example, by adjusting the output of the lamps 41 and 42 of the epitaxial growth apparatus 11. For simplicity here, a case where the arrays of the lamps are concentrically arranged in two arrays, the inner one and the outer one, is described as shown in FIG. 3.

That is, with regard to the output ratio of lamp heating, "When the range of the outer-peripheral portion where the film thickness is thin is constant, and the thickness at the outer-peripheral portion is desired to make further thinner in the range where the film thickness is less than 1 (the film thickness at the center=1)."

the top side lamp 41: inner>outer, and the bottom side lamp 42: inner<outer and, the top side lamp 41: increases the inner proportion, and the bottom side lamp 42: increases the inner proportion.

In this way, the film thickness at the outer-peripheral portion can be thinner.

"When the film thickness at the outer-peripheral portion is constant in the range where the film thickness is less than 1 (the film thickness at the center=1), and the range of the outer-peripheral portion is desired to make further wider."

the top side lamp 41: inner>outer, and the bottom side lamp 42: inner<outer and, the top side lamp 41: increases the inner proportion, and the bottom side lamp 42: increases the inner proportion.

In this way, the range of the outer-peripheral portion where the film thickness is thin can be further widened.

Note that even in the case of three arrays, as in FIG. 2, (inner array: 41a, 42a, middle array: 41b, 42b, outer array: 41c, 42c), for example, it is possible to treat only 41a and 42a as the inner lamps and, 41b, 42b, 41c, and 42c as the outer lamps. The four or more arrays can be determined as appropriate in the same way.

By adjusting a magnitude relation of the output between the inner lamps and the outer lamps as described above, the film thickness ratio of the outer-peripheral portion relative to the center or the range of the outer-peripheral portion can be adjusted, and a specific output ratio is varied according to the apparatus 11 used or the size of the silicon substrate 2. Moreover, as shown in the correlation described above, both a degree of thinness of the film thickness at the outer-peripheral portion and a degree of an extent of the range of the outer-peripheral portion are varied by the output ratio of the lamps. Therefore, when the inventive epitaxial wafer 1 is actually produced, the output ratio of the lamps may be determined as appropriate with referring to the correlation described above depending on the desired conditions of the epitaxial film.

As an example, a case is exemplified, in which the epitaxial film 3 (silicon germanium film) is vapor-phase grow on the silicon substrate 2 having a diameter of 300 mm at 650° C. using CENTURA manufactured by APPLIED MATERIALS, Inc. (the lamps are arranged in two arrays: the inner array and the outer array), when the range of the outer-peripheral portion is fixed in the range of 10 mm inward from the periphery, in order to make the film thickness at the outer-peripheral portion 0.95 to 0.98 when the film thickness at the center is 1, the top side lamp 41: inner (51 to 60%)>outer (49 to 40%), and the bottom side lamp 42: inner (26 to 30%)<outer (75 to 70%)

can be set as above, in order to make the film thickness at the outer-peripheral portion 0.90 to 0.98, the top side lamp 41: inner (61 to 75%)>outer (39 to 25%), and the bottom side lamp 42: inner (31 to 34%)<outer (71 to 66%)

can be set as above, in order to make the film thickness at the outer-peripheral portion 0.80 to 0.98, the top side lamp 41: inner (76 to 80%)>outer (24 to 20%), and the bottom side lamp 42: inner (35 to 38%)<outer (65 to 60%)

can be set as above.

EXAMPLE

Hereinafter, the present invention will be specifically described with reference to Examples and Comparative Examples. However, the present invention is not limited thereto.

Example 1

A silicon germanium epitaxial film was formed on a silicon substrate having a diameter of 300 mm in a mixed gas atmosphere containing $SiH_2Cl_2$ and $GeH_4$ as a raw material gas using an epitaxial growth apparatus (RP-CVD apparatus: CENTURA manufactured by APPLIED MATE-RIALS Inc.) (lamps are arranged in two arrays: an inner array and an outer array), and the film was formed so as to had a film thickness of 30 nm at a center of the epitaxial film, and a film thickness of 28.5 to 29.5 nm at an outer-peripheral portion (in a range of up to 10 mm inward from a periphery) (a ratio of the film thickness at the outer-peripheral portion to the film thickness at the center: 0.95 to 0.98), resulting in a defect density of $0.06/cm^2$.

Note that the film thickness of the epitaxial film was measured by using a spectroscopic ellipsometer (M2000 manufactured by J. A. Woolam).

Moreover, the defect density was measured by using Surfscan SP3 manufactured by KLA-Tencor Corporation.

Example 2

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 10 mm inward from a periphery) of 27.0 to 29.5 nm (film thickness ratio: 0.90 to 0.98). As a result, a defect density was $0.06/cm^2$.

Example 3

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 10 mm inward from a periphery) of 24.0 to 29.5 nm (film thickness ratio: 0.80 to 0.98). As a result, a defect density was $0.04/cm^2$.

Example 4

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 20 mm inward from a periphery) of 28.5 to 29.5 nm (film thickness ratio: 0.95 to 0.98). As a result, a defect density was $0.05/cm^2$.

Example 5

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 5 mm inward from a periphery) of 28.5 to 29.5 nm (film thickness ratio: 0.95 to 0.98). As a result, a defect density was $0.12/cm^2$.

Comparative Example 1

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 5 mm inward from a periphery) of 30.0 to 31.5 nm (film thickness ratio: 1 to 1.05). As a result, a defect density was $2.52/cm^2$.

Comparative Example 2

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 10 mm inward from a periphery) of 30.0 to 31.5 nm (film thickness ratio: 1 to 1.05). As a result, a defect density was $5.32/cm^2$.

Comparative Example 3

An epitaxial wafer was formed under the same conditions as in Example 1, except that the epitaxial wafer to be evaluated was formed so as to make a film thickness at the center of the epitaxial film of 30 nm and a film thickness at the outer-peripheral portion (in a range of up to 20 mm inward from a periphery) of 30.0 to 31.5 nm (film thickness ratio: 1 to 1.05). As a result, a defect density was $7.37/cm^2$.

The film forming conditions and the measurement results in each example are shown in Table 1. That is, the following are shown in each column:

(1) An output ratio between inner lamps (Inner Power) and outer lamps (Outer Power) at a top side (Top Side)

(2) An output ratio between inner lamps and outer lamps at a bottom side (Bottom Side)

(3) A ratio of the film thickness at the outer-peripheral portion relative to the film thickness at the center (film thickness at outer-peripheral portion/film thickness at center)

(4) A range of an outer-peripheral portion (5) Defect density

In addition, Example 1 is described with overlapping, and for (1) and (2), an equality sign and inequality sign are also noted to easily understand the relationship between the inner and outer lamps.

Moreover, Table 2 shows another summary regarding (3) to (5). With respect to (3), the film thickness value thereof at the outer-peripheral portion is also shown. Value enclosed in a bold frame is defect density in (5).

TABLE 1

| | Top Side | | Bottom Side | | Film | Range of Outer- | |
|---|---|---|---|---|---|---|---|
| | Inner Power | Outer Power | Inner Power | Outer Power | Thickness Ratio | Peripheral Portion | Defect Density |
| Example 5 | 54% > 46% | | 29% < 71% | | 0.95-0.98 | 5 mm | 0.12/cm² |
| Example 1 | 56% > 44% | | 29.5% < 70.5% | | 0.95-0.98 | 10 mm | 0.06/cm² |
| Example 4 | 58% > 42% | | 30% < 70% | | 0.95-0.98 | 20 mm | 0.05/cm² |
| Example 1 | 56% > 44% | | 29.5% < 70.5% | | 0.95-0.98 | 10 mm | 0.06/cm² |
| Example 2 | 70% > 30% | | 33% < 67% | | 0.90-0.98 | 10 mm | 0.06/cm² |
| Example 3 | 78% > 22% | | 35% < 65% | | 0.80-0.98 | 10 mm | 0.04/cm² |
| Comparative Example 1 | 50% = 50% | | 28% < 72% | | 1-1.05 | 5 mm | 2.52/cm² |
| Comparative Example 2 | 48% < 52% | | 27.5% < 72.5% | | 1-1.05 | 10 mm | 5.32/cm² |
| Comparative Example 3 | 46% < 54% | | 27% < 73% | | 1-1.05 | 20 mm | 7.37/cm² |

TABLE 2

| Film Thickness Value | Film Thickness Ratio | Range of Outer-Peripheral Portion (5 mm) | Range of Outer-Peripheral Portion (10 mm) | Range of Outer-Peripheral Portion (20 mm) |
|---|---|---|---|---|
| 24.0-29.5 nm | 0.80-0.98 | — | 0.04/cm² (Example 3) | — |
| 27.0-29.5 nm | 0.90-0.98 | — | 0.06/cm² (Example 2) | — |
| 28.5-29.5 nm | 0.95-0.98 | 0.12/cm² (Example 5) | 0.06/cm² (Example 1) | 0.05/cm² (Example 4) |
| 30.0-31.5 nm | 1-1.05 | 2.52/cm² (Comparative Example 1) | 5.32/cm² (Comparative Example 2) | 7.37/cm² (Comparative Example 3) |

From Tables 1 and 2, the following relations were confirmed for the film thickness ratio, the range of the outer-peripheral portion, and the defect density in particular.

First, each Example was compared with each Comparative Example.

With respect to a magnitude relation of the output ratio between the inner lamps and the outer lamps, that of each Example and each Comparative Example was set to "inner<outer" for the bottom side lamps, while that of each Example was set to "inner>outer" for the top side lamps, but that of Comparative Example 1 was set to "inner=outer," and that of Comparative Examples 2 and 3 were set to "inner<outer." In addition, the defect density was 0.04 to 0.12/cm² in each Example, while that of each Comparative Example was 2.52 to 7.37/cm²; each Example had few defects by orders magnitude compared to each Comparative Example. It is indicated that adjusting the output ratio between the inner lamps and the outer lamps is effective in reducing the defect density.

Moreover, each Example was compared to the others.

In Examples 5, 1, and 4, where the film thickness ratios were all identical (0.95 to 0.98), and the ranges of the outer-peripheral portion were 5 mm, 10 mm, and 20 mm, the defect densities were 0.12/cm², 0.06/cm², and 0.05/cm²; the defect density tended to decrease as the range of the outer-peripheral portion was widened.

In addition, in Examples 5, 1, and 4, when the output ratios of the top side lamps were "inner>outer" and those of the bottom side lamps were "inner<outer," the higher the output ratio of the inner lamps of the top side and the bottom side, the wider the range of the outer-peripheral portion tended to be.

In Examples 1, 2, and 3, where the ranges of the outer-peripheral portion were all identical (10 mm), and the film thickness ratios were 0.95 to 0.98, 0.90 to 0.98, 0.80 to 0.98, the defect densities were 0.06/cm², 0.06/cm², and 0.04/cm²; the smaller the film thickness ratio. i.e., the thinner the film thickness at the outer-peripheral portion relative to the film thickness at the center, the decreased defect density tended to be.

In addition, in Example 1, 2, and 3, when the output ratios of the top side lamps were "inner>outer" and those of the bottom side lamps were "inner<outer," the higher the output ratio of the inner lamps of the top side and the bottom side, the lower the film thickness ratio tended to be.

The present description includes the following embodiments.

[1]: An epitaxial wafer, comprising an epitaxial film of a semiconductor material different from silicon being formed on a silicon substrate, wherein
the epitaxial film has a film thickness of less than 1 at a wafer outer-peripheral portion when a film thickness at a center of the wafer is defined as 1.

[2]: The epitaxial wafer of the above [1], wherein
the wafer outer-peripheral portion is in a range of up to 5 mm inward from a periphery.

[3]: The epitaxial wafer of the above [1], wherein
the wafer outer-peripheral portion is in a range of up to 10 mm inward from a periphery.

[4]: The epitaxial wafer of the above [1], wherein
the wafer outer-peripheral portion is in a range of up to 20 mm inward from a periphery.

[5]: The epitaxial wafer of any one of the above [1] to [4], wherein
the epitaxial film has a film thickness of 0.95 or more and less than 1 at the wafer outer-peripheral portion.

[6]: The epitaxial wafer of any one of the above [1] to [4], wherein
the epitaxial film has a film thickness of 0.9 or more and less than 1 at the wafer outer-peripheral portion.

[7]: The epitaxial wafer of any one of the above [1] to [4], wherein
the epitaxial film has a film thickness of 0.8 or more and less than 1 at the wafer outer-peripheral portion.

[8]: The epitaxial wafer of any one of the above [1] to [7], wherein
the epitaxial film is any of a silicon germanium film, a germanium film, a silicon carbide film, and gallium nitride film.

[9]: The epitaxial wafer of any one of the above [1] to [8], wherein the epitaxial wafer has a diameter of 300 mm or larger.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. An epitaxial wafer, comprising an epitaxial film of a semiconductor material different from silicon being formed on a silicon substrate, wherein the epitaxial film in a range of up to 10 mm inward from a periphery has a film thickness of less than 1 at a wafer outer-peripheral portion when a film thickness at a center of the wafer is defined as 1, and the epitaxial film is any of a silicon germanium film, a germanium film, and a silicon carbide film.

2. The epitaxial wafer according to claim 1, wherein the wafer outer-peripheral portion is in a range of up to 20 mm inward from a periphery.

3. The epitaxial wafer according to claim 1, wherein the epitaxial film has a film thickness of 0.95 or more and less than 1 at the wafer outer-peripheral portion.

4. The epitaxial wafer according to claim 1, wherein the epitaxial film has a film thickness of 0.9 or more and less than 1 at the wafer outer-peripheral portion.

5. The epitaxial wafer according to claim 1, wherein the epitaxial film has a film thickness of 0.8 or more and less than 1 at the wafer outer-peripheral portion.

6. The epitaxial wafer according to claim 1, wherein the epitaxial wafer has a diameter of 300 mm or larger.

\* \* \* \* \*